(12) United States Patent
De Beer

(10) Patent No.: US 10,403,916 B2
(45) Date of Patent: Sep. 3, 2019

(54) APPARATUS AND METHOD FOR DETERMINING THE CONDITION OF AN ELECTRICITY-PRODUCING CELL

(71) Applicant: University of Cape Town, Rondebosch, Cape Town (ZA)

(72) Inventor: Chris De Beer, Johannesburg (ZA)

(73) Assignee: University of Cape Town, Rondebosch, Cape Town (ZA)

( * ) Notice: Subject to any disclaimer, the term of this patent is extended or adjusted under 35 U.S.C. 154(b) by 344 days.

(21) Appl. No.: 15/320,545

(22) PCT Filed: Jun. 24, 2015

(86) PCT No.: PCT/IB2015/054727
§ 371 (c)(1),
(2) Date: Dec. 20, 2016

(87) PCT Pub. No.: WO2015/198234
PCT Pub. Date: Dec. 30, 2015

(65) Prior Publication Data
US 2018/0212262 A1    Jul. 26, 2018

(30) Foreign Application Priority Data
Jun. 26, 2014 (GB) .................................. 1411419.3

(51) Int. Cl.
*H01M 8/06* (2016.01)
*H01M 8/04537* (2016.01)
(Continued)

(52) U.S. Cl.
CPC ...... *H01M 8/04649* (2013.01); *G01R 31/389* (2019.01); *H01M 8/04559* (2013.01);
(Continued)

(58) Field of Classification Search
CPC ......... H01M 8/04649; H01M 8/04559; H01M 8/04589; H01M 8/04641;
(Continued)

(56) References Cited

PUBLICATIONS

De Beer, C., et al., "Fuel Cell Condition Monitoring Using Optimized Broadband Impedance Spectroscopy," IEEE Transactions on Industrial Electronics, Aug. 2015, vol. 62(8), pp. 5306-5316.
(Continued)

*Primary Examiner* — Jane J Rhee
(74) *Attorney, Agent, or Firm* — Womble Bond Dickinson (US) LLP

(57) ABSTRACT

An apparatus and method for determining the condition of an electricity-producing cell such as a fuel cell is disclosed. A signal is injected into an electricity-producing cell, a voltage and/or current response is measured, and the impedance response of the electricity-producing cell is calculated using the injected signal and the response. The injected signal is a broadband signal that includes a plurality of superimposed waveforms at different frequency set points across a frequency range. The distribution of the waveform frequency set points is linear at either or both of a lower portion and an upper portion of the frequency range, and is logarithmic at a mid-range of the frequency range. The response at each of the frequency set points are simultaneously obtained and the impedance response across the frequency range is calculated and used to determine a condition of the electricity-producing cell.

16 Claims, 10 Drawing Sheets

(51) Int. Cl.
    *G01R 31/389*    (2019.01)
    *H01M 8/1018*    (2016.01)
(52) U.S. Cl.
    CPC ... *H01M 8/04589* (2013.01); *H01M 8/04641* (2013.01); *H01M 2008/1095* (2013.01); *H01M 2250/20* (2013.01); *Y02T 90/32* (2013.01)
(58) Field of Classification Search
    CPC ...... H01M 2008/1095; H01M 2250/20; G01R 31/389; Y02T 90/32
    See application file for complete search history.

(56) References Cited

PUBLICATIONS

De Beer, C., et al: "Online fault diagnostics and impedance signature mapping of High Temperature PEM fuel cells using rapid small signal injection", IECON 2013—39th Annual Conference of the IEEE Industrial Electronics Society, IEEE, Nov. 10, 2013 (Nov. 10, 2013), pp. 1798-1803, XP032538562, ISSN: 1553-572X, DOI: 10.1109/IECON.2013.6699404.

Sanchez, B., et al: "Optimal multisine excitation design for broadband electrical impedance spectroscopy; Optimal multisine excitation design for broadband EIS", Measurement Science and Technology, IOP, Bristol, GB, vol. 22, No. 11, Sep. 13, 2011 (Sep. 13, 2011), p. 115601, XP020213321, ISSN: 0957-0233, DOI: 10.1088/0957-0233/22/11/115601 p. 6-p. 10; figure 6; table 2.

Popkirov, G. S., et al: "Optimization of the Pertubation Signal for Electrochemical Impedance Spectroscopy in the Time Domain", Review of Scientific Instruments, AIP, Melville, NY, US, vol. 64 No. 11, Nov. 1, 1993 (Nov. 1, 1993), pp. 3111-3115, XP000955440, ISSN: 0034-6748, DOI: 10.1063/1.1144316 p. 3111, line 3115; table 1.

Brunetto, C., et al: "PEM fuel cell testing by electrochemical impedance spectroscopy", Electric Power Systems Research, Elsevier, Amsterdam, NL, vol. 79, No. 1, Jan. 1, 2009 (Jan. 1, 2009), pp. 17-26, XP025572098, ISSN: 0378-7796, DOI: 10.1016/J.EPSR.2008.05.012.

APPARATUS AND METHOD FOR DETERMINING THE CONDITION OF AN ELECTRICITY-PRODUCING CELL

CROSS-REFERENCE TO RELATED APPLICATIONS

This application is a national stage filing under 35 U.S.C. section 371 of PCT/IB2015/054727, filed 24 Jun. 2015, which claims priority to United Kingdom patent application number 1411419.3, filed on 26 Jun. 2014, which are each hereby incorporated by reference in this application.

FIELD OF THE INVENTION

This invention relates to an apparatus and method for rapidly determining the condition of an electricity-producing cell such as a fuel cell.

BACKGROUND TO THE INVENTION

Fuel cells are electrochemical devices that convert chemical energy directly to electrical energy. The by-products are typically water and heat. The conversion process is quiet and efficient, making fuel cells attractive for a wide range of applications. Individual fuel cells typically generate a very low output voltage, such as below 1V. To increase the voltage to usable levels, the cells are connected in series and are known as fuel cell stacks. Individual fuel cells can be used for small power packs while larger systems may require a number of stacks connected in such a way so as to produce acceptable voltage levels.

The most commonly used fuel cell technology is the Polymer Electrolyte Membrane (PEM) fuel cell. PEM fuel cells have high power density, high efficiency, and low start-up times making them widely suitable. Single cells may be used to power portable electronics while PEM fuel cell stacks are used as backup power systems. PEM fuel cells are also the technology of choice for automotive manufacturers developing hydrogen fuel cell vehicles.

PEM fuel cells operate below 100° C. and require humidification of their membranes in order to enable proton conduction for proper operation. The need for humidification combined with the internal generation of water gives rise to a number of operational problems. The most common of these include drying and flooding. Other fault conditions can include fuel starvation due to insufficient gas supply rates from the anode or cathode mass flow control systems, or hydrogen crossing over the membrane. The onset of these fault conditions can cause severe loss in performance and in extreme cases cause permanent damage to the internal components of the fuel cell. Thus, it is of great importance to monitor the state of health of fuel cells in order to diagnose possible fault conditions and enable a master control system to take appropriate action to mitigate the fault mechanism. By continuously monitoring the state of health, the system can also optimize operating conditions such as the relative humidity (RH), fuel supply rates or temperature to maximise performance.

When fuel cells are in an inactive state (i.e. not powering a load), techniques for diagnosing the inner phenomena occurring in the fuel cell include polarization curve analysis, where voltage is recorded as a function of current or the other way around, and cyclic voltammetry, where the electrocatalytic surface area of catalyst layers can be determined by sweeping an applied voltage between two set-points and recording the current. These techniques do not work when a fuel cell system is operational and powering a load.

An industry standard for monitoring a fuel cell system while it is operational is by performing Electrochemical Impedance Spectroscopy (EIS). EIS makes use of an expensive Frequency Response Analyzer (FRA) that introduces a voltage or current waveform with a set frequency and amplitude and superimposes the waveform on the DC loading point. The response is then recorded and the impedance calculated. By varying the frequency of the waveform, a plot of impedance versus frequency, called a Nyquist plot, is then produced to represent the impedance trajectory for a range of frequencies by plotting it on the real and imaginary axis. The Nyquist plot gives valuable information on the internal mechanisms of the fuel cell and is a powerful tool for condition monitoring and determining state of health. Existing EIS systems take up to several minutes to produce a Nyquist plot as each frequency harmonic is individually introduced to the fuel cell to limit disturbance.

Fuel cells exhibit extreme non-linear behaviour under fault conditions such as flooding, drying or fuel starvation. It is thus extremely difficult to achieve stable measurements of the impedance for the full frequency range of interest. For the measurements to be acceptable, conditions such as linearity, stability and causality must exist during the measurement period. Because EIS systems take up to several minutes to perform measurements, they are not suitable for diagnosing many fault conditions in fuel cells.

In other kinds of electricity-producing cells, such as electrochemical cells, monitoring the state of health through determining impedance measurements is also important, and current techniques such as EIS are generally time-consuming and may not be suitable during non-linearities particular to those cells.

The technology described in this application seeks to address these problems, at least to some extent.

In this specification, the term "electricity-producing cell" has a wide meaning and includes cells such as fuel cells and electrochemical cells.

The preceding discussion of the background to the invention is intended only to facilitate an understanding of the present invention. It should be appreciated that the discussion is not an acknowledgment or admission that any of the material referred to was part of the common general knowledge in the art as at the priority date of the application.

SUMMARY OF THE INVENTION

In accordance with the invention there is provided a method of determining the condition of an electricity-producing cell comprising: injecting a signal into an electricity-producing cell, measuring one or both of a voltage and current response, and calculating an impedance of the electricity-producing cell using the applied signal and the response, characterized in that the signal is a broadband signal having a plurality of superimposed waveforms at different frequency set points across a frequency range, wherein a distribution of the waveform frequency set points is linear at either or both of a lower portion and an upper portion of the frequency range, and is logarithmic at a mid-range of the frequency range, the response at each of the frequency set points being obtained simultaneously and the impedance response across the frequency range calculated and used to determine a condition of the electricity-producing cell.

Further features provide for the of the waveform frequency to be linear at both the lower portion and upper portion of the frequency range.

Further features provide for the superimposed waveforms to be sinusoidal waveforms; for the injected signal to be a current signal, and for the response to be both voltage and current responses.

Still further features provide for the broadband signal to extend across a range of frequencies of interest determined by the electricity-producing cell; for the range of frequencies to be from about 0.1 Hz to about 10 kHz, preferably from about 0.25 Hz to about 10 kHz.

Yet further features provide for the duration of the broadband signal to be injected into the electricity-producing cell for the length of time required for one period of the lowest frequency set point. In one embodiment, the lowest frequency set point is about 0.25 Hz and the duration of the broadband signal is about 4 seconds.

Further features provide for the lower portion of the frequency range to be between about 0.25 Hz and about 2 Hz, the mid-range of the frequency range to be between about 2 Hz and about 300 Hz, and the upper frequency range to be between about 300 Hz and about 10 kHz.

Yet further features provide for the waveforms to have different amplitudes at different frequency set points across the frequency range; for the amplitudes of the waveforms to be higher at the lower and upper portions of the frequency range, and lower at the mid-range of the frequency range. In one embodiment, the amplitude distribution is an inverse Gaussian distribution around a centre frequency.

Further features provide for the waveforms to have different phase vectors at different frequency set points across the frequency range, wherein the phase vectors are calculated so as to reduce a crest factor of the broadband signal. The phase vectors may be calculated by numerical optimization techniques.

Still further features provide for the method to be carried out on-line on an electricity-producing cell which is in an active state delivering power to a load; and for the method to be carried out on one or more electricity-producing cells, including low voltage single cells.

A yet further feature provides for the electricity-producing cell to be a fuel cell; and for the fuel cell to be a polymer electrolyte membrane (PEM) fuel cell.

The invention extends to apparatus for determining the condition of an electricity-producing cell, comprising a digital signal processor configured to generate a broadband signal having a plurality of superimposed waveforms at different frequency set points across a frequency range, a regulator circuit for injecting the broadband signal into the electricity-producing cell, and a measurement circuit for measuring one or both of a voltage and current response from the electricity-producing cell so that the measured response is digitized and recorded by the digital signal processor, wherein a distribution of the waveform frequency set points is linear at either or both of a lower portion and upper portion of the frequency range, and is logarithmic at a mid-range of the frequency range, the response at each of the frequency set points being obtained simultaneously and the impedance response across the frequency range calculated so as to determine a condition of the electricity-producing cell.

Further features provide for the regulator circuit to include a high bandwidth, low voltage amplifier coupled to a semiconductor which has a low on-state resistance to enable the apparatus to work on single electricity-producing cells or a small number of electricity-producing cells connected in series. Preferably, the electricity-producing cell is a fuel cell, such as a polymer electrolyte membrane (PEM) fuel cell.

BRIEF DESCRIPTION OF THE DRAWINGS

The invention will now be described, by way of example only, with reference to the accompanying representations in which.

DETAILED DESCRIPTION WITH REFERENCE TO THE DRAWINGS

In this description, the embodiments are directed at determining the condition of a fuel cell, but it will be appreciated that the invention is not limited to fuel cells and could be applied to determine the condition of other electricity-producing cells such as electrochemical cells.

Electrochemical spectroscopy is performed on a fuel cell by introducing a current signal onto the direct current (DC) of the fuel cell. The measured voltage response is then captured and the impedance calculated. This is done across a range of frequencies.

For acceptable measurements of the condition of a fuel cell to be obtained, an applied signal must have a small enough amplitude to ensure that the fuel cell is not disturbed so that the response obtained is within acceptable linear ranges. In order to ensure that the system stays within an acceptable region that can be assumed as linear, the voltage response must be maintained within a predetermined value. This voltage value is known as the thermal voltage and can be calculated as follows:

$$V_T = \frac{RT}{F} \quad (1)$$

where R is the gas constant, T is the cell temperature and F is Faraday's constant. For a cell temperature of 70° C., this equates to 30 mV. If the response magnitude is kept below this value, it can be assumed that no additional harmonics at the excited frequencies will be introduced that may influence the measurements.

As will be described herein, a broadband signal is optimized to maximize power at frequencies of interest while minimizing system disturbance. The condition of a fuel cell can be determined by injecting a broadband signal into a fuel cell, measuring the voltage and/or current response, and calculating an impedance of the fuel cell using the signal and the response. The broadband signal includes a plurality of superimposed waveforms at different frequency set points and is optimized in both the time and frequency domains to reduce its peak amplitudes, so that the voltage or current response across a number of different frequencies is measured simultaneously and the impedance response across a range of frequencies rapidly calculated.

Figure 1:
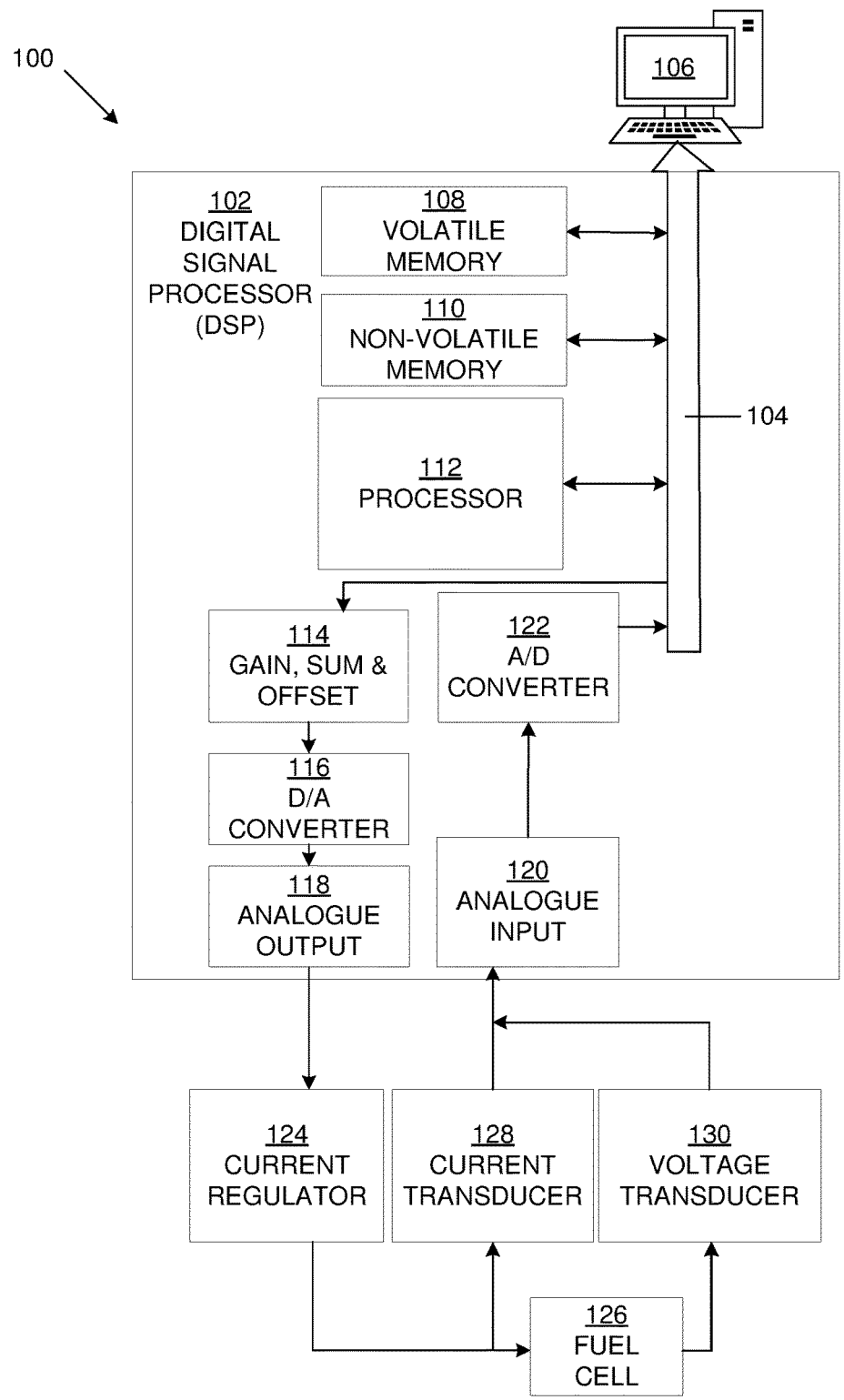
FIG. 1 is a block diagram of an apparatus for determining the condition of an electricity-producing cell, in this case a fuel cell.

FIG. 1 is a block diagram of an apparatus (100) for determining the condition of a fuel cell. The apparatus includes a digital signal processor (DSP) (102) which includes a Peripheral Component Interconnect (PCI) bridge (104) connected to an external computer (106). The DSP (102) has various internal components also connected to the PCI bridge, including volatile memory (108), non-volatile memory (110) and a processor (112). Digital signals generated by the processor are summed, gained and offset (114) and converted to analogue through a digital to analogue converter (116) to yield an analogue output (118). An analogue input (120) is digitized through an analogue to digital converter (122).

In one example, the digital signal processor (102) is implemented on a DSpace™ DS1104 device which has a 64 bit 250 MHz processor (112) and includes 8 MB non-volatile flash memory (110) and 32 MB SDRAM volatile memory (108), with 16 bit digital to analogue and analogue to digital converters (116, 122). Data acquisition on the analogue input (120) can be performed using the 16 bit digital to analogue converter (122) with a sampling frequency of 20 kHz. A DC offset is added by the gain, sum & offset block (114) to ensure that the signal at the analogue output does not zero. Using the DSP, a broadband signal can be generated at the analogue output (118) using predesigned signal vectors stored in the non-volatile memory (110) of the DSP.

The analogue output (118) is connected to a current regulator (124) which then injects a current signal into a fuel cell (126). The fuel cell may be any electrochemical device and in one embodiment is a polymer electrolyte membrane (PEM) fuel cell. Voltage and current feedback from the fuel cell (126) is measured using a non-intrusive current transducer circuit (128) and voltage transducer circuit (130). This feedback is then fed into the analogue input (120) where it is digitized and recorded for signal analysis processing and analysis by the computer (106). In this illustration, the signal analysis and processing was done by the computer (106), because the DSP used includes flexibility for rapid prototyping. It will be appreciated that in a dedicated system, the signal analysis processing could be done in the DSP itself, where a Fast Fourier Transform (FFT) and Nyquist plot could be calculated by the DSP rather than by a separate computer. The DSP can be connected directly to a fuel cell master controller (not shown) so as to inform the controller of the state of health of the fuel cell to enable the controller to take appropriate action.

The apparatus (100) could thus be provided in at least three possible form factors. The apparatus could be a free-standing instrument with its own digital display for giving real-time impedance information. Alternatively, the apparatus could be integrated into existing fuel cell and battery test stations, and have hardware that ties in which the existing electronic loads and software for parameter extraction as required for detailed analysis. Or the apparatus could be provided by way of a circuit board that is integrated with an electric vehicle drive train, or with existing portable fuel cell and battery power packs where external devices such as mobile phones or laptop computers receive data used for estimating state of health.

Figure 2:
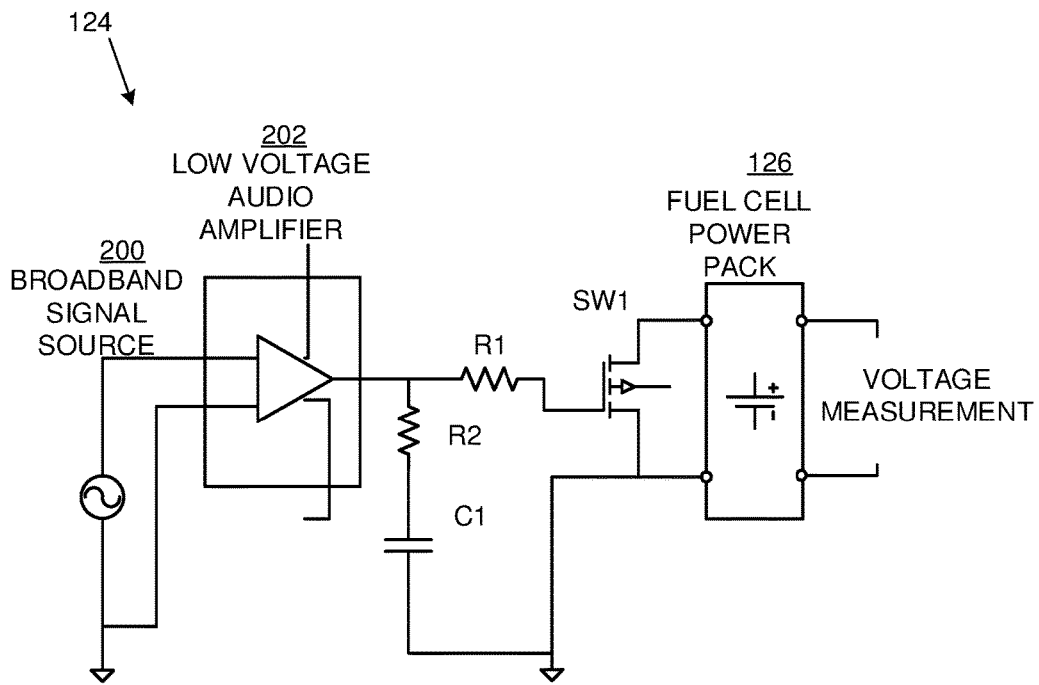
FIG. 2 is a circuit diagram of a current regulator of FIG. 1.

FIG. 2 shows the current regulator (124) of FIG. 1 in more detail. This circuit superimposes the broadband signal source (200) onto the DC current of the fuel cell (126). A high bandwidth low voltage audio amplifier (202) is used to generate a gate drive signal to a semiconductor SW1. In order to realize low voltage and high frequency operation, SW1 is selected to be a high performance MOSFET which has a very low on-resistance, for example a total on-resistance of only 1.2 mΩ. The analogue output of the audio amplifier drives the MOSFET SW1 through a gating resistor R1 in the active region. The minimum drain to source voltage allowed to ensure proper operation is very low, for example only 0.1V, and the maximum may be in the order of 24V. This allows the MOSFET SW1 to operate on single cells at very low voltages, such as below 1V, as well as on small stacks of cells. The small resolution required by the gate drive of the MOSFET SW1 in order to accurately realize the broadband signal is accomplished by properly matching the gain of the audio amplifier (202) to the MOSFET SW1 gate charge and the resistor R1.

To enable determination of the condition of the fuel cell, the broadband signal must be optimized to reduce its peak amplitudes to ensure that the fuel cell is not disturbed and the response obtained is within acceptable linear ranges.

In one embodiment, the superimposed waveforms are sinusoidal waveforms. The broadband signal can be expressed as follows in the time domain:

$$u(t) = \sum_{n=0}^{N-1} a_n \cos(2\pi f_n t + \varphi_n) \quad (2)$$

Where N is the number of frequency set points or harmonics in the signal, $a_n$ is an amplitude matrix, $f_n$ are the excited frequencies and $\varphi_n$ is a phase matrix. By varying the coefficients, this multi-sine broadband signal can therefore have specific amplitudes and phases at each frequency set point of interest.

A multi-sine signal results in superimposition of signals in the time domain, which can lead to very large peak-to-peak amplitudes or crest factor magnitudes. To avoid large amplitudes while providing sufficient resolution and applied signal power to yield acceptable measurements, the broadband signal is optimized according to the techniques described herein.

A first stage in optimizing the broadband signal is identifying a range of frequencies of interest, which is determined by the characteristics of the fuel cell to be analysed, and placing the individual waveforms at specific frequency set points. The number of frequency set points must be minimized to reduce the overall power of the broadband signal, but a sufficient number of frequency set points are required to obtain sufficient resolution to distinguish key features that would indicate the condition of the fuel cell.

With fuel cells, significant information is contained in the low Hz and sub Hz frequencies. At these frequencies, the gas transport phenomena relating to various mechanisms in the electrochemistry of the fuel cell become visible. The frequency band of interest for fuel cells lies generally in the 0.1 Hz to 20 kHz band. Since the lowest frequency of excitation determines the minimum signal time required, shorter signal times can be achieved if the lowest excited frequency is increased. To obtain a real-axis intercept for an impedance Nyquist plot, as will be illustrated in the experimental results below, a very low frequency signal must be injected to measure the value and this frequency must be determined experimentally. It was found that 0.25 Hz is adequate to reach a real axis intercept while maintaining adequately short signal times. With 0.25 Hz as the lowest excited frequency, a minimum signal length of 4 seconds is required to apply a Discrete Fourier Transform (DFT) on the signal to enable analysis thereof.

Figure 3A:
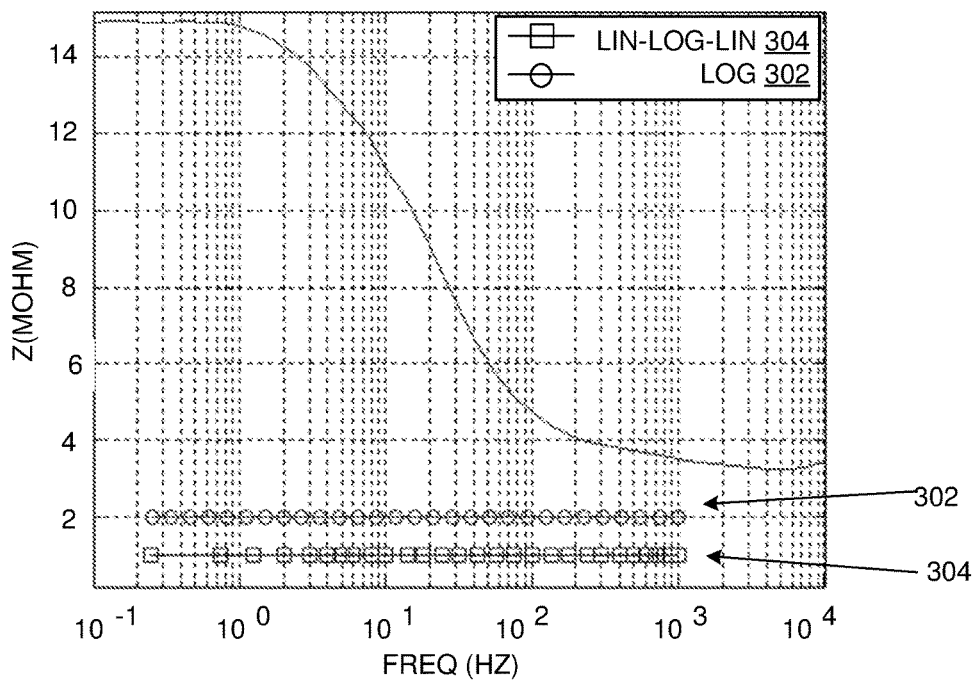
FIG. 3A is a graph showing an impedance magnitude response for a typical healthy fuel cell.
Figure 3B:
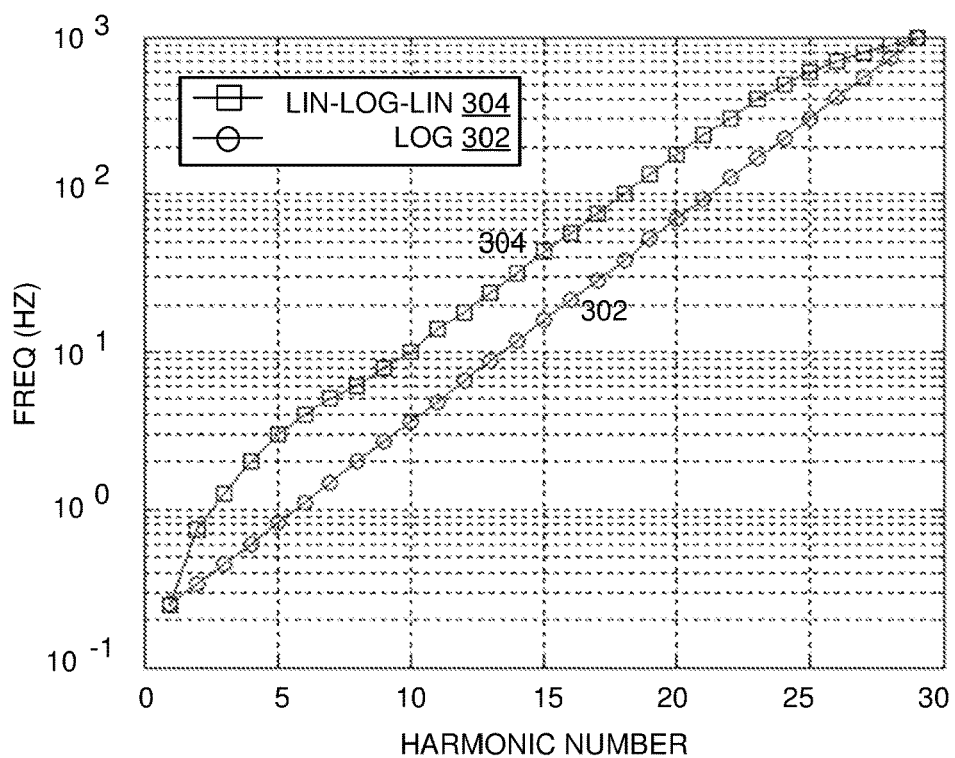
FIG. 3B is a graph showing harmonic number and the corresponding signal frequency for two possible frequency distributions.

FIG. 3A shows an impedance magnitude response for a typical healthy fuel cell. As can be seen, the rate of change in the impedance versus frequency is more significant between about 2 Hz and 300 Hz than below 2 Hz or above 300 Hz. To reduce the number of required frequency set points, reduce harmonic disturbances and provide sufficient resolution, rather than using a purely logarithmic distribution (302) across the range of frequencies, a linear-logarithmic-linear distribution (304) is used. The harmonic number and the corresponding signal frequency for the two possible distributions (302, 304) is shown in FIG. 3B. In the sub Hz region, where there are a limited number of measured cycles in the signal, the chosen distribution must ensure that aliasing and spectral leakage is minimized. This can be accomplished by appropriately distributing the lower frequency band to ensure that the DFT zeroes for each excited frequency in the spectrum. A linear distribution, with a minimum frequency selected as the inverse of the total signal time, will ensure this. In this case, a minimum frequency of 0.25 Hz is chosen and the signal time is 4 seconds.

While the linear distribution at the lower frequency band will ensure that maximum resolution will be obtained, a linear distribution across the entire frequency range will require far too many frequency set points and thus result in too much applied power. Furthermore, non-linearities in the fuel cell can introduce second order harmonics at the fundamental frequencies, and a linear distribution across the entire frequency spectrum can receive harmonic feedback. For this reason, a logarithmic function for the frequency set points is used in a centre frequency band where the greatest change in the magnitude response takes place, which in this case is from about 2 Hz to 300 Hz. For the high frequency region (above 300 Hz) a linear distribution is again followed to minimize complexity in the synthesis and decompression algorithms. A lower number of frequency set points is required in the upper region as the Nyquist plot has an inherently high resolution.

One example of such a composite broadband signal can be expressed as follows:

$$fn = \begin{cases} F_b + nF_0 & \text{for } 0 \le n < A \\ 10^{\left(\frac{F_b}{\alpha}\right) \times (n-\beta)} & \text{for } A \le n \le B \\ 100(n+2-B) & \text{for } B < n \le N-1 \end{cases} \quad (3)$$

$$A = \frac{2 - F_b}{F_0} \quad (4)$$

$$B = \frac{2.477\alpha}{F_b} + \beta \quad (5)$$

where $F_b$ is the base frequency and $F_b=1/(\text{signal time})$; $F_0=2\times F_b$ and $n=0, 1, 2 \ldots N-1$, to ensure a linear distribution in the lower band between harmonic numbers 0 and A, where A is determined according to the base frequency $F_b$ as given by equation 4. In the frequency mid-range between harmonic numbers A and B, the coefficients $\alpha$ and $\beta$ were selected experimentally through making fine adjustments to ensure that the distribution does not repeat harmonics and that the piece-wise derivative is greater than $F_0$ to ensure spectral leakage is minimized. One example of values used that were found to give good results were $\alpha=2$ and $\beta=0.5$. In the upper frequency range between harmonic numbers B and N-1, the distribution is again linear.

The total number of frequency set points, N, should be chosen to minimize signal complexity while maximizing resolution and impedance information. This requires knowledge of the variation of the impedance response for normal operational conditions and possible fault conditions. While a wide range of suitable numbers of frequency set points could be used, it was found that for PEM fuel cells a total of 29 frequency set points (i.e. N=29) provided acceptable performance.

A second stage in optimizing the broadband signal is selecting the amplitudes of each waveform at each frequency set point—i.e. determining the amplitude spectrum. The amplitudes of each frequency set point must be selected so as to provide good signal to noise ratios throughout the measured frequency band while reducing the peak to peak amplitudes of the total summed broadband signal.

A typical impedance magnitude response of a fuel cell is high at low frequencies and decreasing towards the upper frequencies, and one option for designing the amplitude spectrum is to take the inverse of the inherent fuel cell magnitude response. However, it was found that fuel cells can include errors in their impedance response at low frequencies resulting from using only a single period of the lowest excitable frequency (in one embodiment, 4s for a lowest frequency of 0.25 Hz). The resultant signal power introduced over only one period is too low to enable the fuel cell gas transport dynamics to be accurately measured in the feedback signal. Accordingly, an optimized amplitude spectrum based on an inverse Gaussian distribution around a centre frequency is used. This spectrum has amplitudes that are higher at lower and upper portions of the frequency range, and lower at a mid-range of the frequency range. At the lower frequency range, the amplitudes are maximized to ensure that sufficient energy is introduced to determine the dynamic gas transport impedance. In the mid frequency band, the amplitude is reduced and allows for a reduced peak to peak amplitude in the total summed broadband signal while maintaining acceptable signal to noise ratio. At high frequencies, where the magnitude response of the fuel cell is small, the amplitude will be increased towards the maximum to increase signal to noise ratio.

Figure 4:
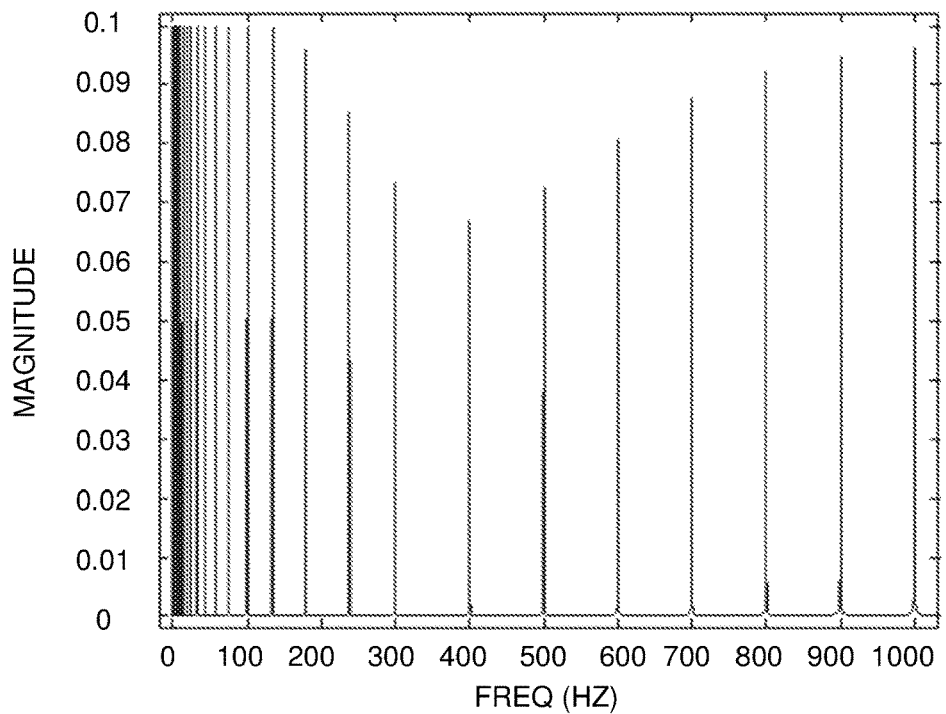
FIG. 4 is a graph showing an optimized amplitude spectrum.

The magnitude of each frequency set point can be determined according to this inverse Gaussian distribution as follows:

$$a_n = a_b - \varepsilon \sqrt{\frac{\gamma}{2\pi f_n^3}} \exp\left[\frac{-\gamma(f_n - \mu)^2}{2\mu^2 f_n}\right] \quad (6)$$

where $a_b$ is the maximum harmonic amplitude, $\varepsilon$ is a weighting parameter, $\mu>0$ is a mean and $\gamma>0$ is a shape parameter. The calculated amplitude spectrum using equation (6) for a mean frequency of $\mu=500$ Hz is shown in FIG. 4.

Finally, a third stage in optimizing the broadband signal is to calculate the phase vectors to minimize the crest factor of the broadband signal. The broadband signal should have its energy concentrated around the maximum amplitudes. Whether or not this is the case can be evaluated by measuring the crest factor of the broadband signal. A large crest factor indicates the broadband signal is spread too widely between the maximum amplitudes and will result in a larger peak to peak value for a given magnitude spectrum. By minimizing the crest factor, the signal power is maximized thereby increasing the signal to noise ratio and reducing the peak amplitude of the broadband signal.

As previously mentioned, for acceptable measurements to be obtained, the system must be kept stable and within a linear operating region for the duration of the broadband signal. By reducing the crest factor of the signal, the fuel cell is subjected to less disturbance thereby remaining close to the linear region of operation. Crest factor (CF) can be determined by known techniques using the following formula:

$$CF = \frac{\sqrt{2} \max|u(t)|}{\sqrt{\sum_{n=0}^{N-1} a_n^2}}, t \in [0, T] \quad (7)$$

By using the crest factor as a minimization function and phase vector as controlled parameters, the broadband signal can be optimized using non-linear optimization algorithms according to any non-linear mathematical optimization techniques, for example those provided by the MATLAB® optimization toolbox.

Figure 5A:
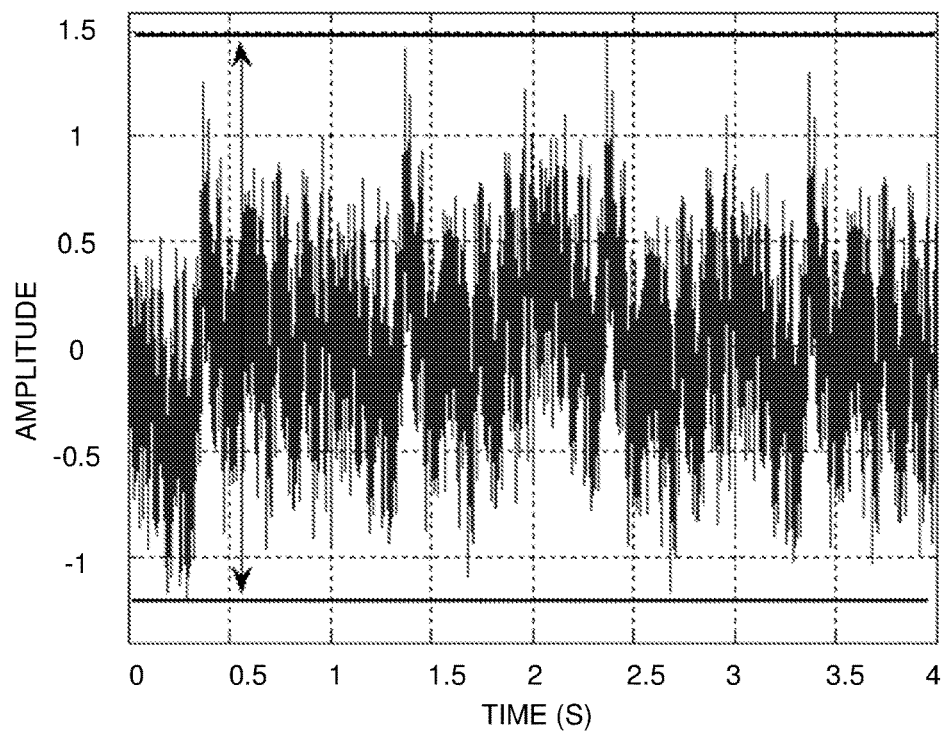
FIG. 5A is a plot showing amplitude over time for a composite broadband signal with random phase vectors.

FIG. 5A shows amplitude over time for a composite broadband signal which has been optimized according to only the first two described steps, but with random phase vectors. In other words, the frequency set points were chosen according to the linear-logarithmic-linear distribution and the amplitude distribution was given the inverse Gaussian distribution, but the phases were assigned at random. This broadband signal has a crest factor of 3.812 and a peak to peak amplitude of 2.662, indicating poor energy concentration around the maximum amplitudes.

Figure 5B:
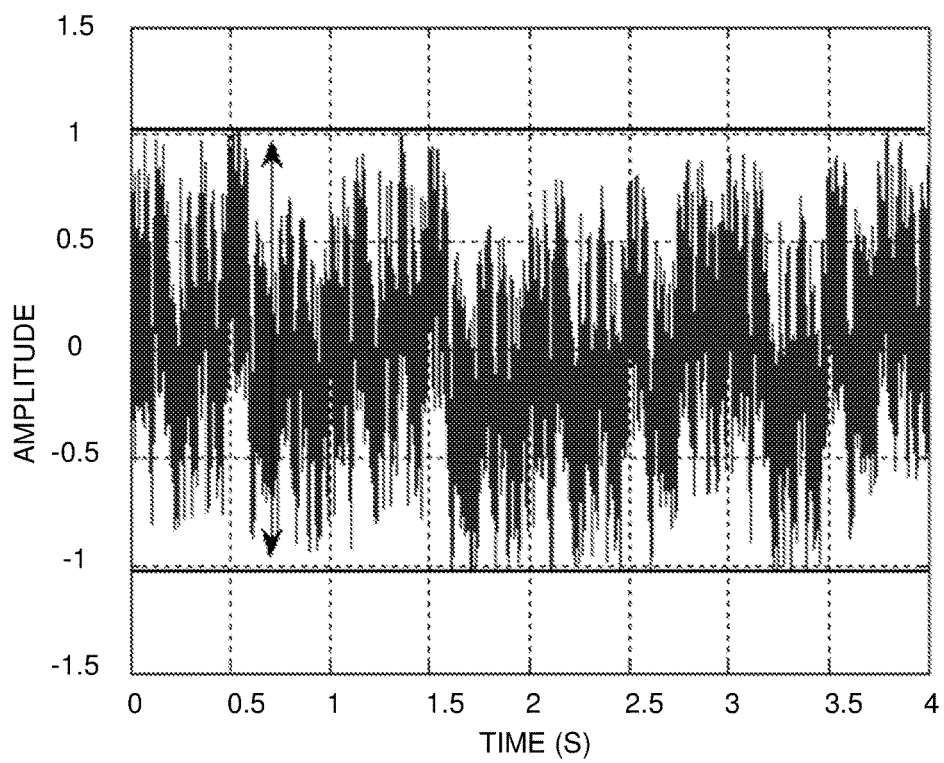
FIG. 5B is similar to FIG. 5A but shows the broadband signal with optimized phase vectors.

FIG. 5B is similar to FIG. 5A but the phase vectors were optimized in the time domain using the MATLAB® optimization toolbox in order to minimize the crest factor so as to reduce the peak to peak magnitude of the broadband signal. The crest factor of this broadband signal is only 2.8 and the peak to peak amplitude is 2.03. The improvements in these values leads to a greater concentration of energy at the peak magnitudes of the signal. This leads to a smaller disturbance when it is introduced into the fuel cell as a current perturbation. The magnitude of the broadband signal can also be proportionately increased while keeping the system within an acceptable range to ensure that non-linearity is kept to a minimum in the system response.

Experimental Results—Single Fuel Cell

The apparatus and method described herein was tested and compared with conventional EIS under drying, flooding and oxygen starvation conditions.

The test set-up was a commercial FuelCon test station with a Baltic fuel cell test assembly. The fuel cell was a single polymer electrolyte membrane (PEM) fuel cell and was fed with air on the cathode side and research-grade hydrogen on the anode side at 1 atm. The stoichiometry of the anode and cathode were 1.5 and 2.0 retrospectively, and the membrane was humidified using the inline humidification system with an initial relative humidity of 100%. To avoid unwanted flooding, the gas transfer lines were heated to 120° C. while the cell temperature was varied between 60° C. and 80° C. During initial testing, the flow of the anode and cathode were kept at 0.45 Standard Liter per Minute (SLPM) and 1 SLPM respectively to avoid interference that may be caused by the mass flow controllers during transients.

Experiment 1: Drying

Drying was performed by running the fuel cell at a low current density for a predetermined period of time to minimize water production in the cathode. The humidification was lowered by dropping the temperature of the humidifiers below that of the fuel cell.

Figure 6A:
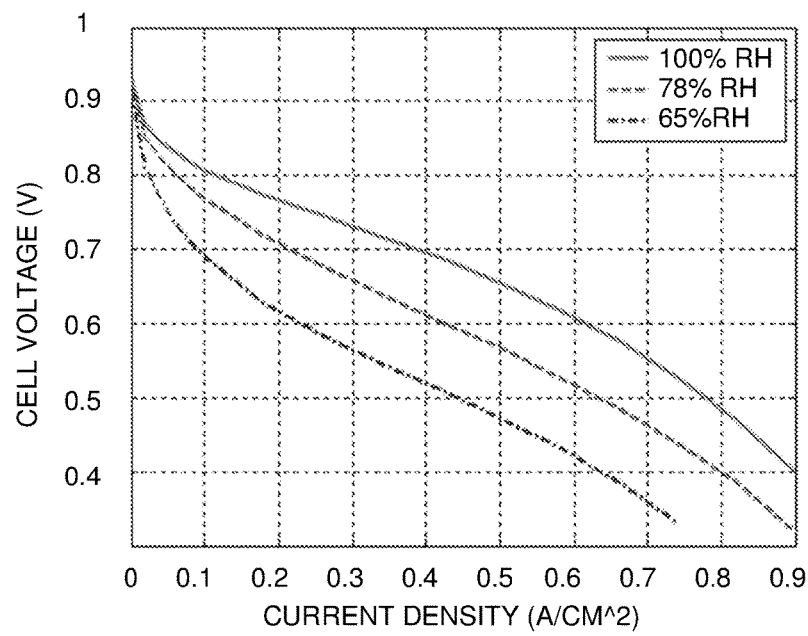
FIG. 6A is a graph showing polarization curves for three different relative humidity conditions, including low relative humidities.
Figure 6B:
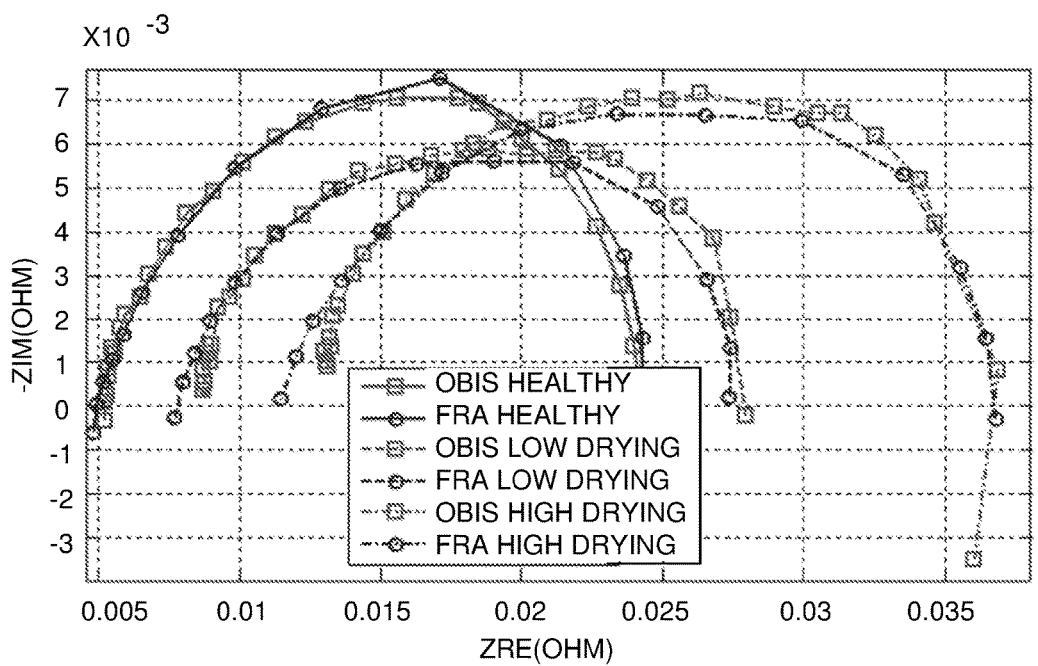
FIG. 6B shows experimental results in the form of Nyquist plots at each of the three conditions of FIG. 6A.

FIG. 6A shows polarization curves for three different relative humidity conditions—100%, 78% and 65%. The loss of membrane conductivity on performance is evident which increases the Ohmic losses of the cell. FIG. 6B shows the experimental Nyquist plots obtained at each of these three conditions ("Healthy" being 100%, "Low Drying" being 78% and "High Drying" being 65%) using a conventional frequency response analyser (FRA) EIS technique, and also using the technique described in this application, which in the diagrams is labelled OBIS—"Optimized Broadband Impedance Spectroscopy". The FRA EIS required about 5 min to complete each measurement cycle compared to 4 seconds for the OBIS system. The results indicate very good agreement between the two methods while the OBIS system of the invention produced superior resolution. In this experiment, the FRA EIS was conducted first, and the time lapse between the tests caused minor variations in the membrane water content as water is continuously generated by the reaction, which is the most probable cause for the slight differences observed.

Experiment 2: Flooding

Figure 7A:
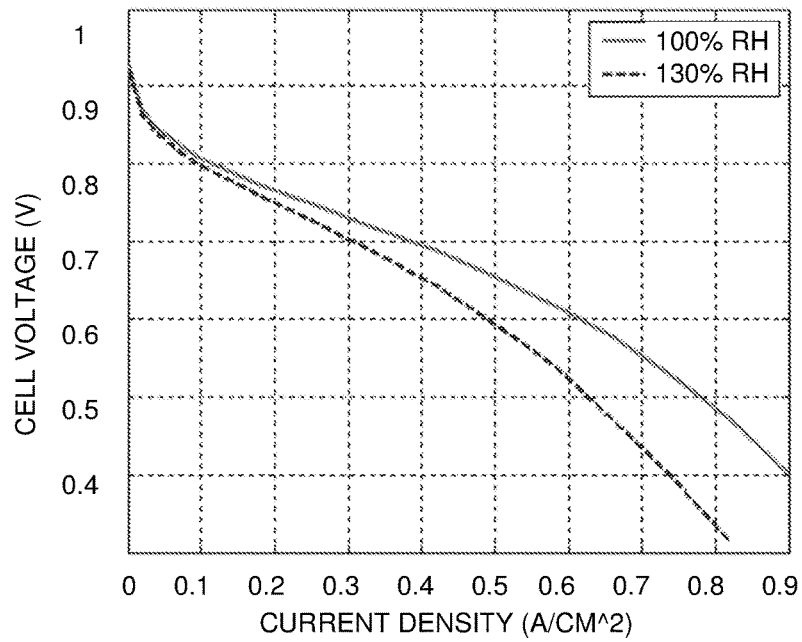
FIG. 7A is a graph showing polarization curves for two different relative humidity conditions, including a high relative humidity.
Figure 7B:
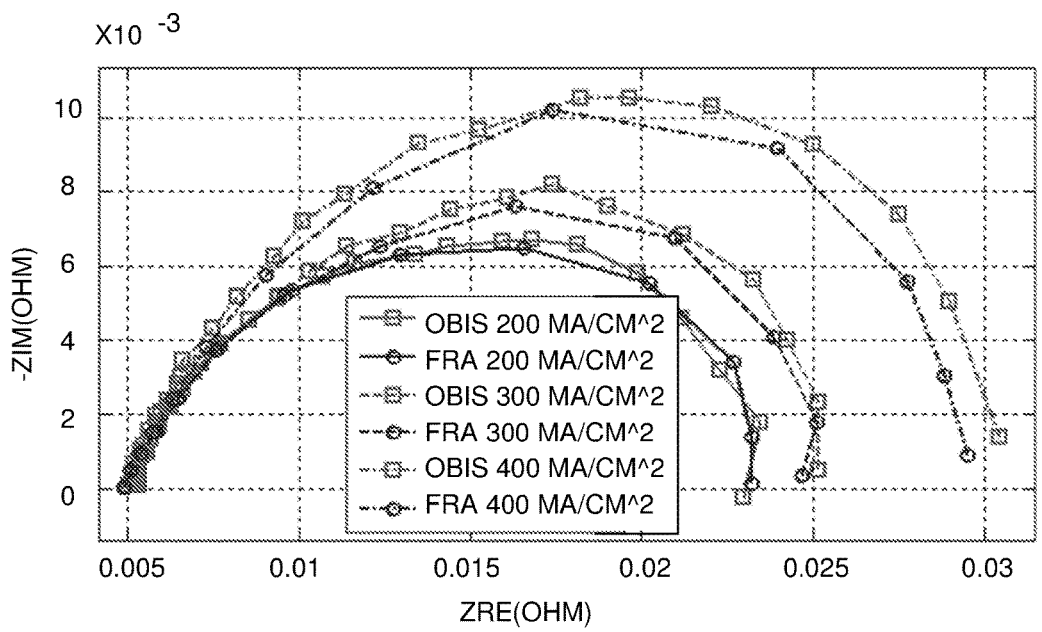
FIG. 7B shows experimental results in the form of Nyquist plots for a high relative humidity of FIG. 7A and different current densities.

Flooding was performed by increasing the humidifier temperatures to above that of the fuel cell thereby running a relative humidity of well above 100%. FIG. 7A shows polarization curves for two different relative humidity conditions—100% and 130%. Higher degrees of flooding were found to result in unstable measurements and could not produce proper curves. FIG. 7B shows the experimental Nyquist plots using the conventional FRA EIS technique, and using the OBIS technique of this application. The results for relative humidity at 130% are shown at different current densities of 200 mA/cm$^2$, 300 mA/cm$^2$ and 400 mA/cm$^2$. The results are in very good agreement taking into account the small variation caused by water generation in the time between each pair of measurements. Again, while the FRA EIS technique takes around 5 min to complete each measurement, the OBIS technique requires only 4 seconds.

Experiment 3: Extreme Non-Linear Flooding Conditions

Figure 8A:
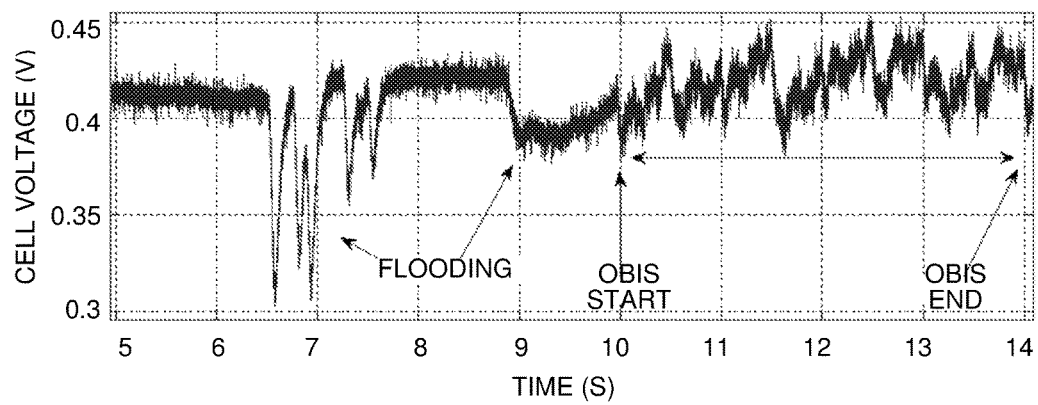
FIG. 8A is a voltage profile showing non-linear conditions that occur during extreme flooding.

To demonstrate the ability of the system to perform under extreme non-linear conditions, the fuel cell was run until droplet formation in the flow fields was severely accelerated. For this condition, polarization curves and EIS could not be recorded as the system was unable to reach steady state for a long enough period of time to acquire viable data. The current density was increased to 720 mA/cm2 to enforce internal water production while the gas transfer line temperature was lowered to 60° C. to enforce condensation. The voltage profile during this test and the OBIS signal injection is presented in FIG. 8A. The non-linear behaviour of the flooding is evident and indicated in the profile.

The OBIS signal is introduced at the 10s mark where the cell voltage was close to the initial steady state value. The time duration of the measurement was 4 seconds and is indicated in the voltage profile. It is clear that long measurement times to acquire the EIS data will not result in usable data as the intervals between the flooding non-linearities will cause inconsistencies in the measurements. Only the OBIS technique of this application will work in this instance.

Figure 8B:
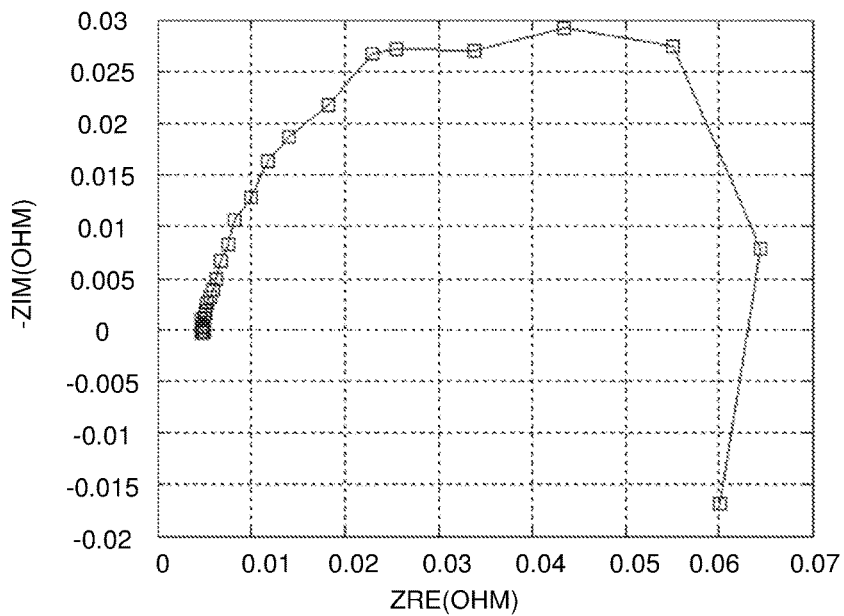
FIG. 8B is a Nyquist plot of a measurement taken during a relatively stable short portion of the voltage profile of FIG. 8A.

The resulting Nyquist plot is shown in FIG. 8B. The drastic increase in the diameter of the plot is evident. The resolution of the arc in the low frequency region is reduced due to the influence of the flooding mechanism on the gas transport kinetics. The ability to generate the Nyquist diagrams under these types of extreme conditions gives a unique insight into the impedance response of the fuel cell and can be related to the electrochemistry using applicable modelling methods.

Experiment 4: Oxygen Starvation

Figure 9A:
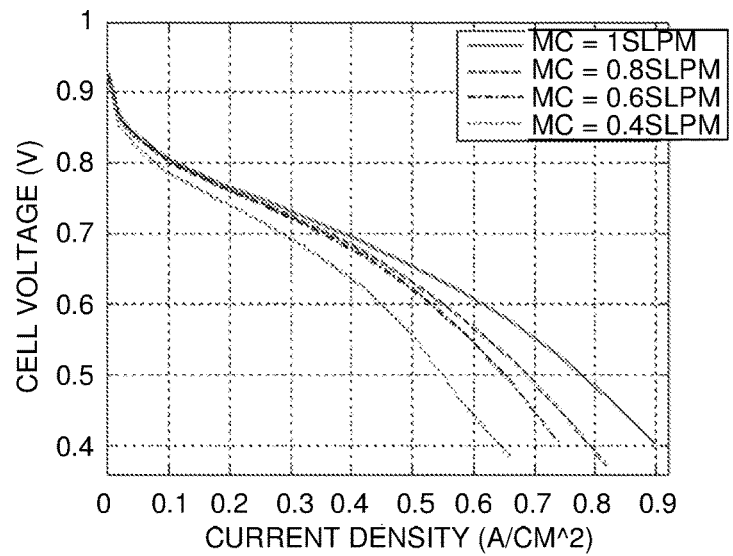
FIG. 9A is a graph showing polarization curves during different levels of oxygen starvation.
Figure 9B:
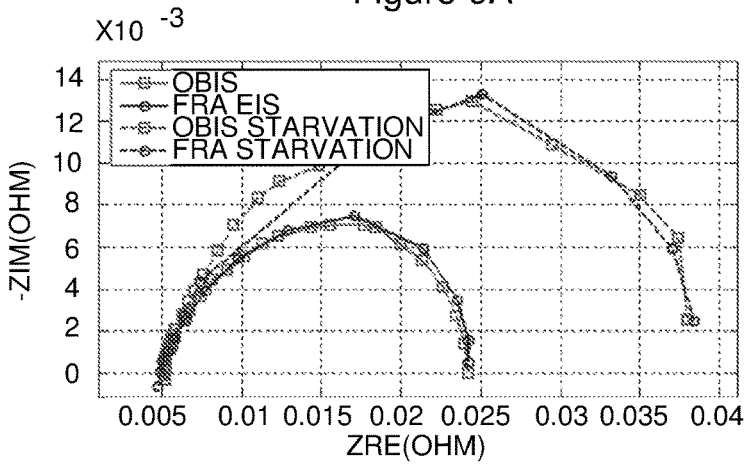
FIG. 9B shows experimental results in the form of Nyquist plots under normal conditions and oxygen starvation conditions.

To simulate oxygen starvation, the flow rate of the cathode gas stream was sequentially reduced until a characteristic change in the polarization curves could be observed. Reducing the flow rate causes increased mass transport losses in the cell as shown in FIG. 9A. The impedance of the fuel cell was recorded using the commercial FRA EIS and the OBIS system and is shown in FIG. 9B. It should be noted that under these conditions, the cell starts becoming unstable to variations and load. The FRA failed to measure data at certain frequency set-points and caused a reduction in the Nyquist plot resolution and variance. The results from the OBIS system produced better results with the reduction in measurement time and the designed magnitude and frequency distributions. The increase in diameter is clearly visible for both data sets when compared to the healthy condition.

Figure 10:
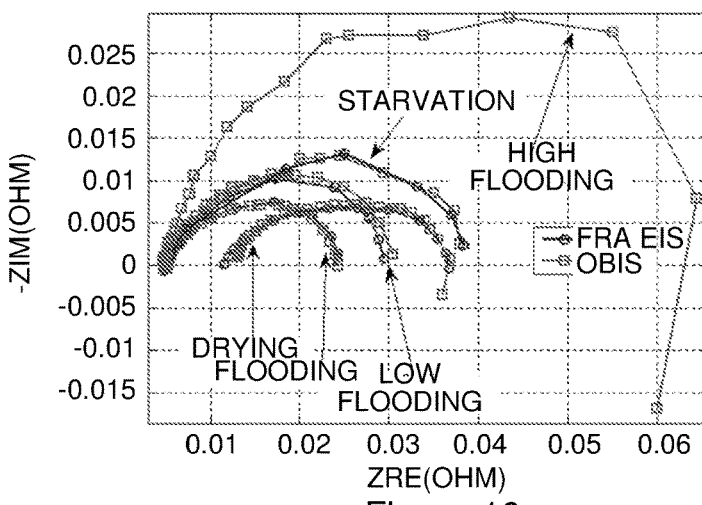
FIG. 10 shows an impedance signature map of Nyquist plots showing how various fault conditions can be distinguished from each other.

To compare the variation in the Nyquist plots for different faults, an impedance signature map is presented in FIG. 10. The drying fault is clearly identifiable as the Ohmic resistance is increased and the Nyquist plot shifts away from the origin to the right. Extreme values of flooding will result in the drastic changes in the diameter while lower flooding levels are more difficult to distinguish from faults such as starvation.

Experimental Results: Fuel Cell Stack

To verify the results of the single fuel cell experiments on a fuel cell stack, a short stack of 4 cells, with a combined rated output power of 100 W, was housed in a commercial Baltic Fuel Cells assembly. The catalyst coated membranes of the fuel cells consisted of Nafion® 211 membranes with carbon supported platinum catalyst. The total surface area of the cells was 49 cm$^2$. After sub-gaskets were attached onto the membranes, standard carbon paper based gas diffusion layers were attached the complete membrane electrode assembly compressed between graphite bipolar plates. The fuel cells stack was heated using a liquid heating and cooling system to a standard operating temperature of 80° C.

Figure 11A:
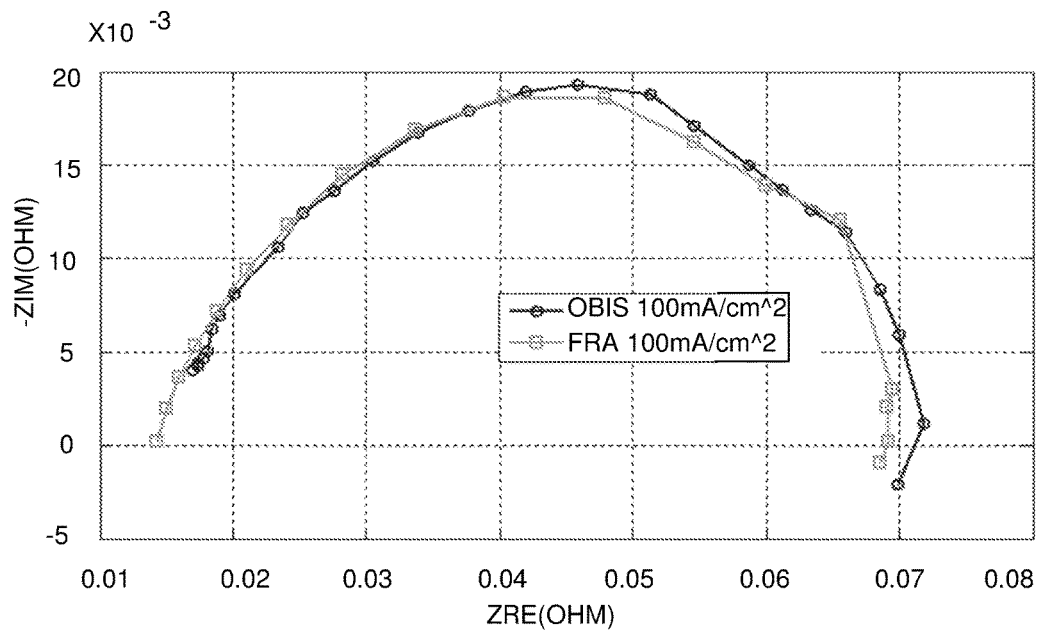
FIG. 11A shows experimental results for a fuel cell stack in the form of Nyquist plots for a low current density.

FIG. 11A shows Nyquist plots for FRA EIS measurements and OBIS measurements of the invention recorded at the same operating points for a low current density of 100 mA/cm$^2$. A low current density was chosen so as to reduce differences in impedance parameters recorded between the OBIS and FRA EIS systems that results from production of water in the fuel cell stack. As can be seen, there is a very good correlation between the OBIS and FRA EIS system measurements. Of course, the commercial FRA EIS took several minutes to complete whereas the OBIS system completed its measurements in only 4 seconds.

Figure 11B:
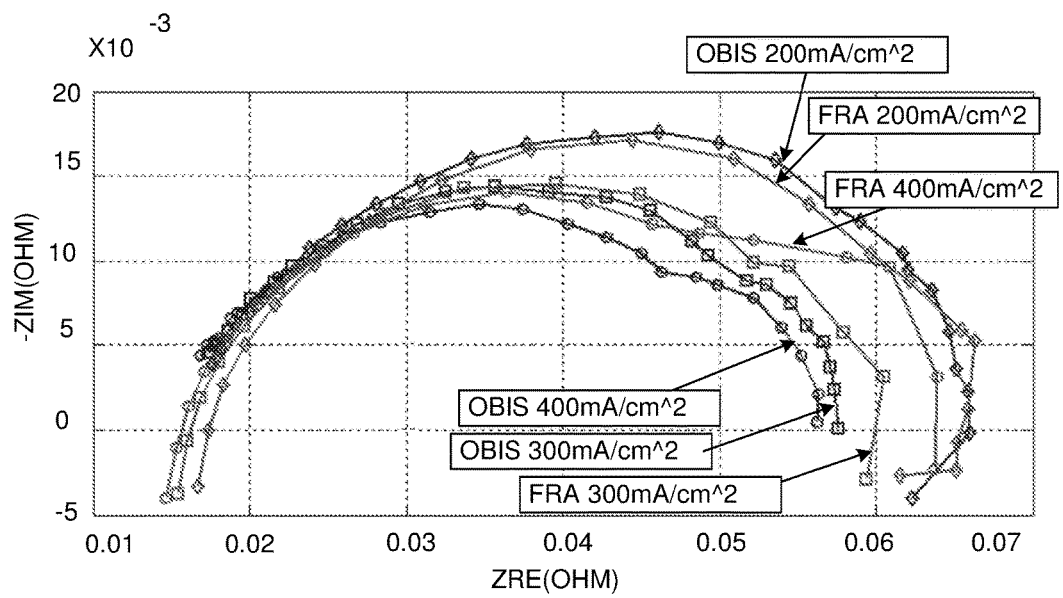
FIG. 11B is similar to FIG. 11A but shows the experimental results for higher current densities.

FIG. 11B shows Nyquist plots for the FRA EIS measurements and OBIS measurements at higher current densities of 200 mA/cm$^2$, 300 mA/cm$^2$ and 400 mA/cm$^2$. For measurements at higher current densities, the OBIS system produces less measurement error and less non-linearity in the low frequency region (right and side of the Nyquist plot) due to the much quicker measurement time than for FRA EIS.

Figure 12A:
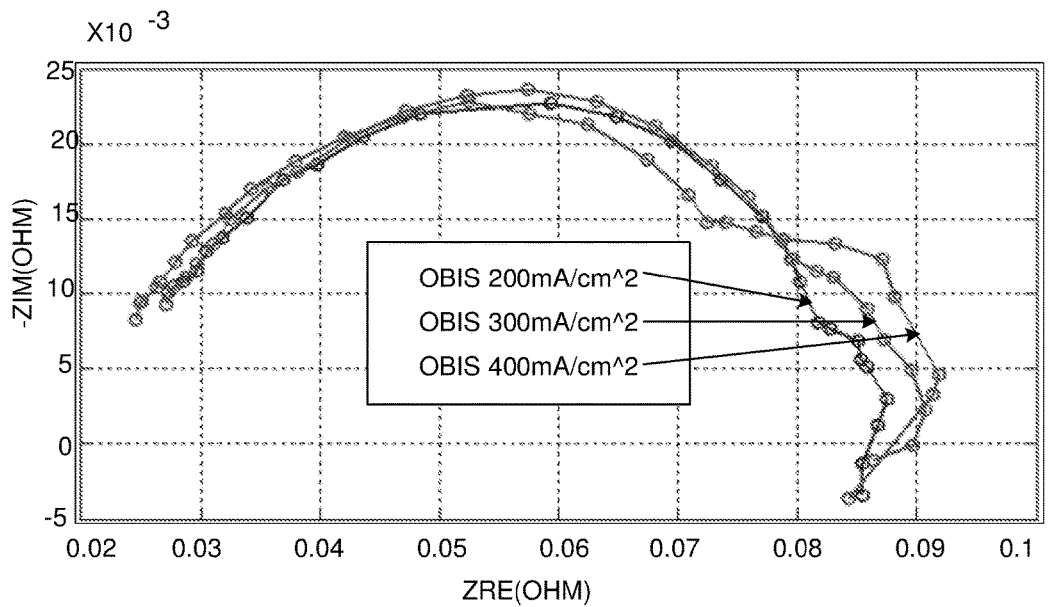
FIG. 12A shows experimental results in the form of Nyquist plots for the invention under drying conditions at different current densities.
Figure 12B:
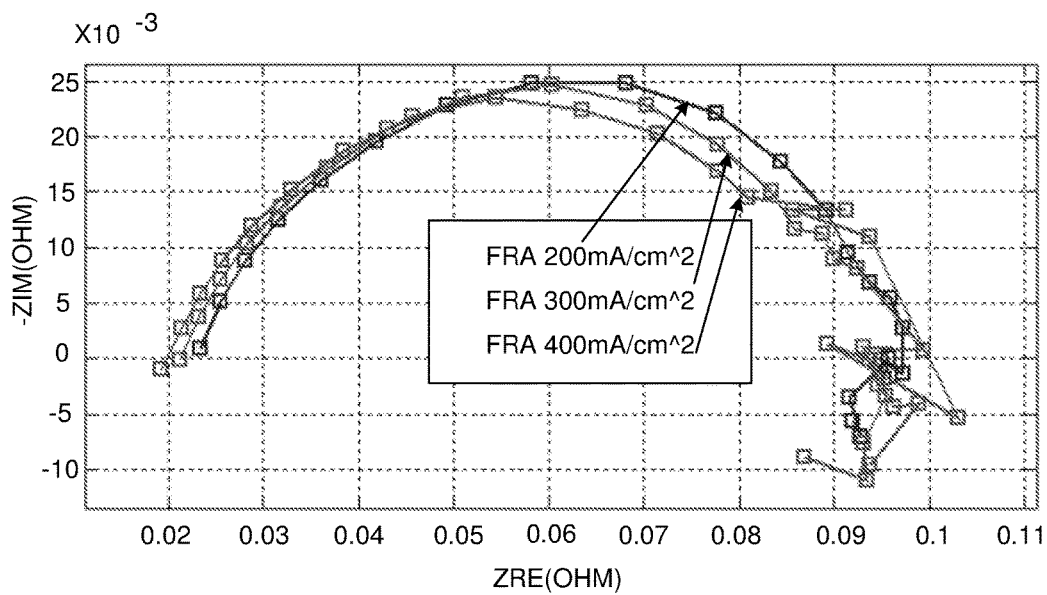
FIG. 12B is similar to FIG. 12A but shows the results for an existing technique.

The fuel cell stack was then run in a drying condition by lowering the humidifier temperature to 60° C. A direct comparison between the OBIS and FRA EIS systems was difficult as operation of the fuel cell stack causes significant variation to the impedance spectra between measurement intervals. The results for the OBIS system of the invention are shown in FIG. 12A and those for the FRA EIS system in FIG. 12B. The drying condition increases membrane ionic resistance and operation at higher current densities slightly decreases this resistance value as recorded by both systems. Poor measurement results were obtained by FRA EIS in the low frequency region (right hand side of the Nyquist plot) while the OBIS system produced superior results. As can be seen in the OBIS results of FIG. 12A, the increase in the diameter of the low frequency arc is a clear indication that the stack is over-compressed, while this is much less clear in the FRA EIS results of FIG. 12B.

The invention accordingly provides a low cost device and associated method that enable the condition of an electricity-producing cell such as a fuel cell to be rapidly and accurately determined while the electricity-producing cell is operational. Rapid determination of the condition of the electricity-producing cell enables the apparatus and method to be used even under extreme non-linear conditions and enables appropriate action to be taken by a control system of the electricity-producing cell to rectify a problem such as drying, flooding or oxygen starvation. The method and apparatus disclosed herein is capable of obtaining impedance measurements significantly faster than previously used methods.

Throughout the specification and claims unless the contents requires otherwise the word 'comprise' or variations such as 'comprises' or 'comprising' will be understood to imply the inclusion of a stated integer or group of integers but not the exclusion of any other integer or group of integers.

The invention claimed is:

1. A method of determining the condition of an electricity-producing cell comprising: injecting a signal into an electricity-producing cell, measuring one or both of a voltage and current response, and calculating an impedance of the electricity-producing cell using the applied signal and the response, wherein the signal is a broadband signal having a plurality of superimposed waveforms at different frequency set points across a frequency range, and wherein a distribution of the waveform frequency set points is linear at either or both of a lower portion and an upper portion of the frequency range, and is logarithmic at a mid-range of the frequency range, the response at each of the frequency set points being obtained simultaneously and the impedance response across the frequency range calculated and used to determine a condition of the electricity-producing cell.

2. The method as claimed in claim 1, wherein the distribution of the waveform frequency is linear at both the lower portion and upper portion of the frequency range.

3. The method as claimed in claim 1, wherein the superimposed waveforms are sinusoidal waveforms and the injected signal is a current signal.

4. The method as claimed in claim 1, wherein the frequency range is from 0.1 Hz to 10 kHz.

5. The method as claimed in claim 1, wherein the broadband signal is injected into the electricity-producing cell for the length of time required for one period of the lowest frequency set point.

6. The method as claimed in claim 1, wherein the lower portion of the frequency range is between about 0.25 Hz and about 2 Hz, the mid-range of the frequency range is between about 2 Hz and about 300 Hz, and the upper frequency range is between about 300 Hz and about 10 kHz.

7. The method as claimed in claim 1, wherein the waveforms have different amplitudes at different frequency set points across the frequency range.

8. The method as claimed in claim 7, wherein the amplitudes of the waveforms are higher at the lower and upper portions of the frequency range, and lower at the mid-range of the frequency range.

9. The method as claimed in claim 8, wherein an amplitude distribution of the waveforms is an inverse Gaussian distribution around a centre frequency.

10. The method as claimed in claim 1, wherein the waveforms have different phase vectors at different frequency set points across the frequency range, wherein the phase vectors are calculated to reduce a crest factor of the broadband signal.

11. The method as claimed in claim 1, wherein the method is carried out on-line on an electricity-producing cell which is in an active state delivering power to a load.

12. The method as claimed in claim 1, wherein the electricity-producing cell is a fuel cell and the fuel cell is a polymer electrolyte membrane (PEM) fuel cell.

13. An apparatus for determining the condition of an electricity-producing cell, comprising a digital signal processor configured to generate a broadband signal having a plurality of superimposed waveforms at different frequency set points across a frequency range with a distribution of the waveform frequency set points being linear at either or both of a lower portion and upper portion of the frequency range and logarithmic at a mid-range of the frequency range, a regulator circuit for injecting the broadband signal into the electricity-producing cell, and a measurement circuit for measuring, simultaneously at each of the frequency set points, one or both of a voltage and current response from the electricity-producing cell, the measured response being digitized and recorded by the digital signal processor, and wherein the digital signal process is further configured to calculate the impedance response across the frequency range so as to determine a condition of the electricity-producing cell.

14. The apparatus as claimed in claim 13, wherein the regulator circuit includes a high bandwidth, low voltage amplifier coupled to a semiconductor which has a low on-state resistance to enable the apparatus to work on single electricity-producing cells or a small number of electricity-producing cells connected in series.

15. The apparatus as claimed in claim 13, wherein the electricity-producing cell is a fuel cell and the fuel cell is a polymer electrolyte membrane (PEM) fuel cell.

16. The method as claimed in claim 1, wherein the frequency range is from 0.25 Hz to 10 kHz.

* * * * *